US010347585B2

(12) United States Patent
Shin et al.

(10) Patent No.: US 10,347,585 B2
(45) Date of Patent: Jul. 9, 2019

(54) FAN-OUT SEMICONDUCTOR PACKAGE

(71) Applicant: SAMSUNG ELECTRO-MECHANICS CO., LTD., Suwon-Si, Gyeonggi-Do (KR)

(72) Inventors: Seung Wan Shin, Suwon-Si (KR); Seung Chul Oh, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/946,109

(22) Filed: Apr. 5, 2018

(65) Prior Publication Data

US 2019/0122990 A1 Apr. 25, 2019

(30) Foreign Application Priority Data

Oct. 20, 2017 (KR) ........................ 10-2017-0136474

(51) Int. Cl.

*H01L 23/495* (2006.01)
*H01L 23/538* (2006.01)

(Continued)

(52) U.S. Cl.

CPC ...... *H01L 23/5389* (2013.01); *H01L 21/4853* (2013.01); *H01L 21/4857* (2013.01);

(Continued)

(58) Field of Classification Search

CPC ............. H01L 21/4853; H01L 21/4857; H01L 21/565; H01L 23/5389; H01L 23/3128;

(Continued)

(56) References Cited

U.S. PATENT DOCUMENTS 7,858,441 B2 * 12/2010 Lin .................. H01L 23/49816 438/109
8,072,059 B2 * 12/2011 Shim .................... H01L 21/568 257/698

(Continued)

FOREIGN PATENT DOCUMENTS

KR 10-2011-0002807 A 1/2011
KR 10-1613525 B1 4/2016

OTHER PUBLICATIONS

Taiwanese Office Action dated Feb. 21, 2019 issued in Taiwanese Patent Application No. 107112462 (with English translation).

*Primary Examiner* — Luan C Thai

(74) *Attorney, Agent, or Firm* — Morgan, Lewis & Bockius LLP

(57) ABSTRACT

A fan-out semiconductor package includes: a first semiconductor chip having a first active surface having first connection pads; a first encapsulant encapsulating the first semiconductor chip; a first connection member disposed on the first active surface and including a first redistribution layer electrically connected to the first connection pads; a second semiconductor chip having a second active surface having second connection pads; a second encapsulant covering the first connection member and encapsulating the second semiconductor chip; a second connection member disposed on the second active surface and including a second redistribution layer electrically connected to the second connection pads; and a third via penetrating through the second encapsulant, connecting the first redistribution layer and the second redistribution layer to each other, and including a metal post connected to the first redistribution layer and a via conductor disposed on the metal post and connected to the second redistribution layer.

23 Claims, 17 Drawing Sheets

(51) Int. Cl.
*H01L 23/31* (2006.01)
*H01L 23/00* (2006.01)
*H01L 21/48* (2006.01)
*H01L 21/56* (2006.01)

(52) U.S. Cl.
CPC ........ *H01L 21/565* (2013.01); *H01L 23/3114* (2013.01); *H01L 23/3128* (2013.01); *H01L 23/5383* (2013.01); *H01L 23/5386* (2013.01); *H01L 23/562* (2013.01); *H01L 24/19* (2013.01); *H01L 24/20* (2013.01); *H01L 2224/214* (2013.01); *H01L 2924/3511* (2013.01)

(58) Field of Classification Search
CPC ............. H01L 23/5386; H01L 23/3114; H01L 23/5383; H01L 23/5283; H01L 24/19; H01L 24/20
USPC .......................................................... 257/668
See application file for complete search history.

(56) References Cited

U.S. PATENT DOCUMENTS 8,133,762 B2 * 3/2012 Pagaila ................. H01L 21/568 438/117
8,174,109 B2 * 5/2012 Uchiyama ............. H01L 21/486 257/686
8,349,658 B2 * 1/2013 Chi ..................... H01L 21/4832 257/666
9,082,806 B2 * 7/2015 Lin ..................... H01L 21/6835
9,502,391 B2 * 11/2016 Kwon ..................... H01L 24/82
2011/0001245 A1 1/2011 Jobetto
2014/0124960 A1 5/2014 Boon et al.
2016/0260684 A1 9/2016 Zhai et al.
2016/0338202 A1 * 11/2016 Park ........................ H01L 23/48
2017/0103951 A1 4/2017 Lee et al.

* cited by examiner

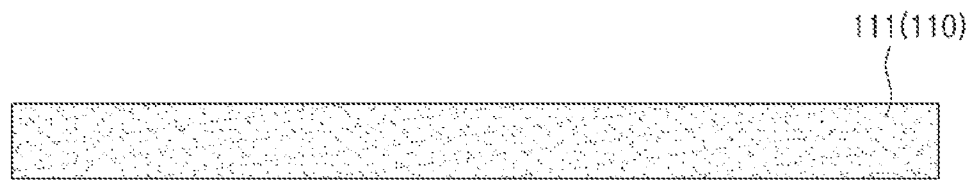
FIG. 10A
111(110)
FIG. 10B
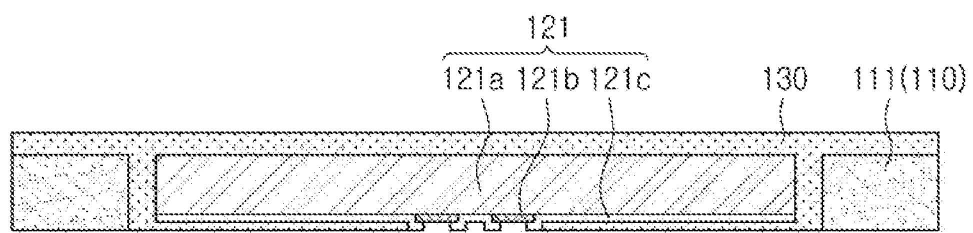
FIG. 10C

FAN-OUT SEMICONDUCTOR PACKAGE

CROSS-REFERENCE TO RELATED APPLICATION(S)

This application claims benefit of priority to Korean Patent Application No. 10-2017-0136474 filed on Oct. 20, 2017 in the Korean Intellectual Property Office, the disclosure of which is incorporated herein by reference in its entirety.

TECHNICAL FIELD

The present disclosure relates to a fan-out semiconductor package.

BACKGROUND

Semiconductor packages have been continuously required to be thinned and lightened in terms of a shape and weight, and have been required to be implemented in a system in package (SiP) form requiring complexity and multi-functionality in terms of functions.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package capable of being thinned and having improved performance and excellent reliability in spite of using a plurality of semiconductor chips.

According to an aspect of the present disclosure, a fan-out semiconductor package may be provided, in which a plurality of semiconductor chips are stacked and packaged, and vias connecting upper and lower redistribution layers to each other are disposed in a stack via form.

According to an aspect of the present disclosure, a fan-out semiconductor package may include: a first semiconductor chip having a first active surface having first connection pads disposed thereon and a first inactive surface opposing the first active surface; a first encapsulant encapsulating at least portions of the first semiconductor chip; a first connection member disposed on the first active surface of the first semiconductor chip and including a first via and a first redistribution layer electrically connected to the first connection pads through the first via; a second semiconductor chip having a second active surface having second connection pads disposed thereon and a second inactive surface opposing the second active surface, the second inactive surface being attached to the first connection member; a second encapsulant covering at least portions of the first connection member and encapsulating at least portions of the second semiconductor chip; a second connection member disposed on the second active surface of the second semiconductor chip and including a second via and a second redistribution layer electrically connected to the second connection pads through the second via; and a third via penetrating through the second encapsulant, connecting the first redistribution layer and the second redistribution layer to each other, and including a metal post connected to the first redistribution layer and a via conductor disposed on the metal post and connected to the second redistribution layer.

BRIEF DESCRIPTION OF DRAWINGS

The above and other aspects, features, and advantages of the present disclosure will be more clearly understood from the following detailed description taken in conjunction with the accompanying drawings, in which:

FIGS. 10A through 10M are schematic views illustrating an example of processes of manufacturing the fan-out semiconductor package of FIG. 9;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a “connection” of a component to another component in the description includes an indirect connection through an adhesive layer as well as a direct connection between two components. In addition, “electrically connected” conceptually includes a physical connection and a physical disconnection. It can be understood that when an element is referred to with terms such as “first” and “second”, the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
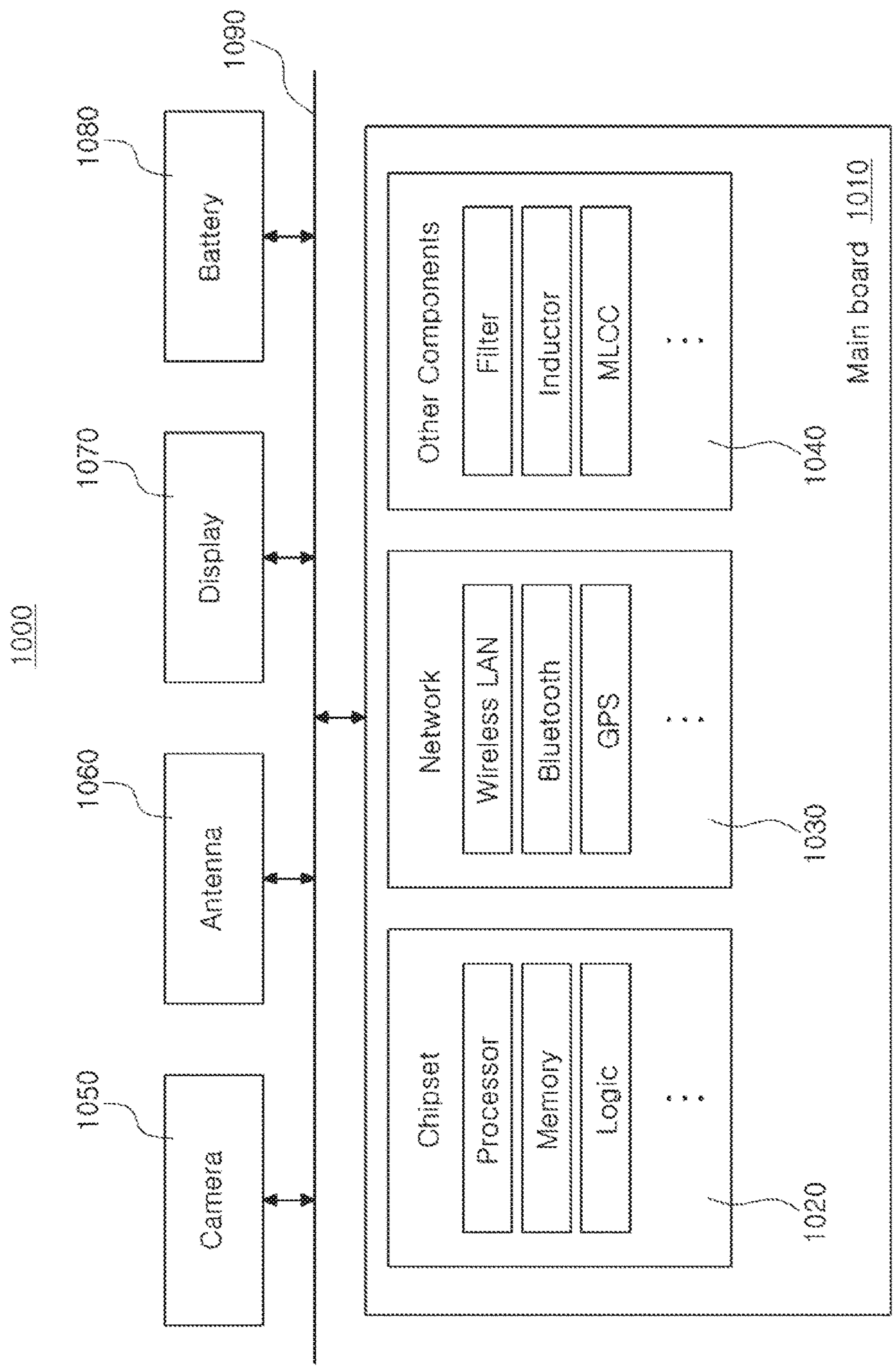
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
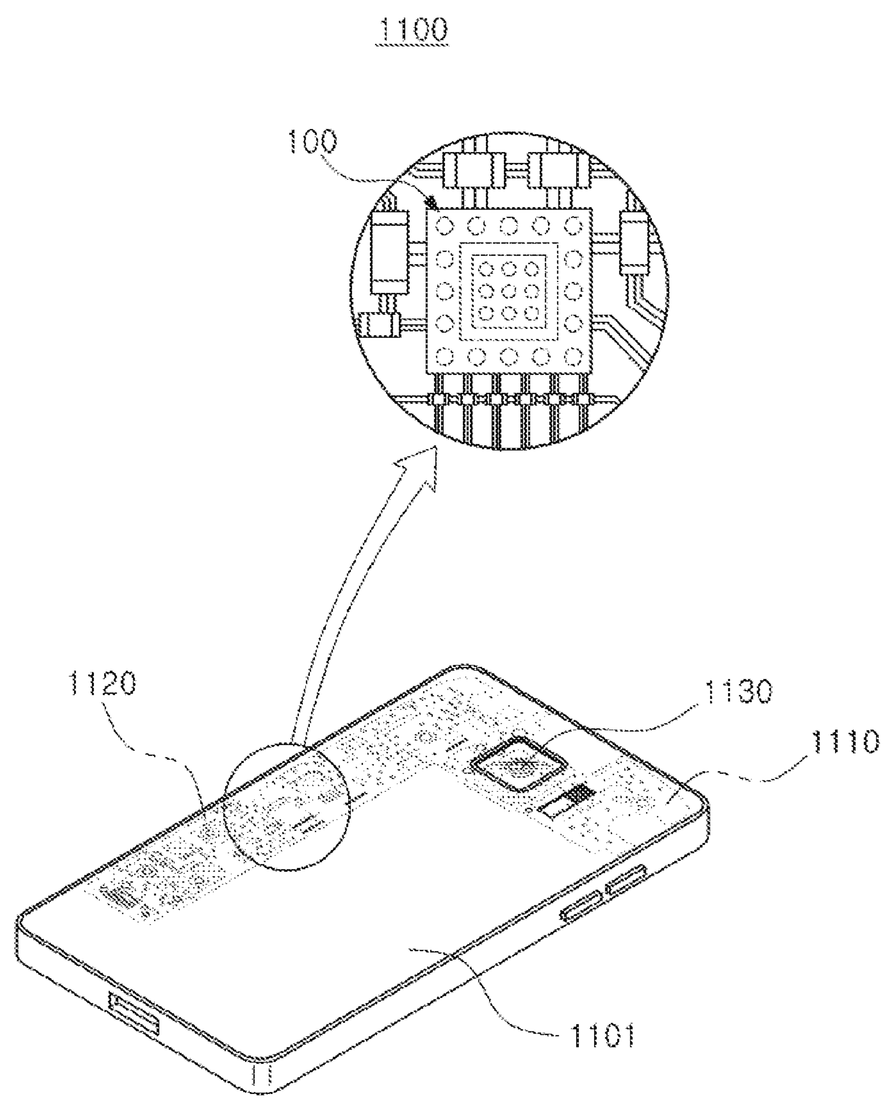
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
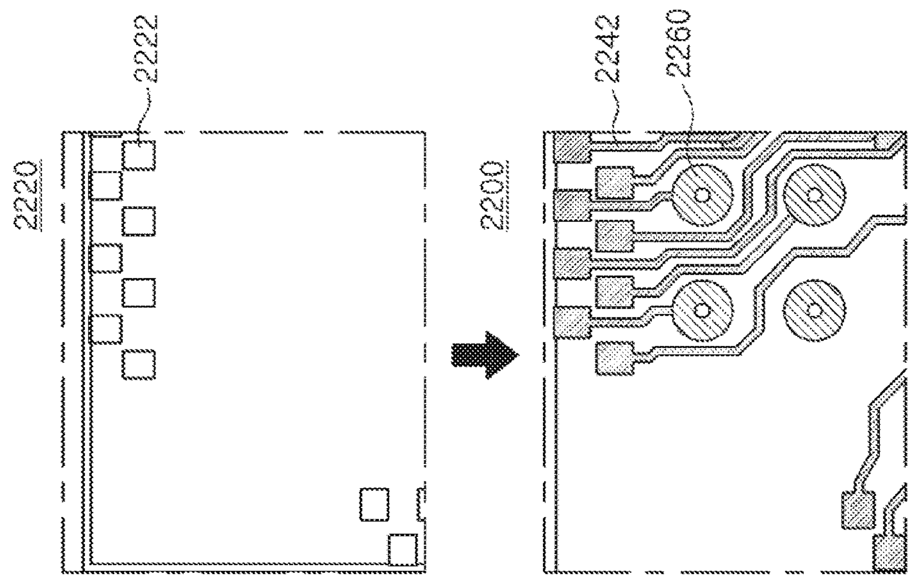
FIGS. 3A and 3B are schematic cross-sectional views illustrating states of a fan-in semiconductor package before and after being packaged.
Figure 3A:
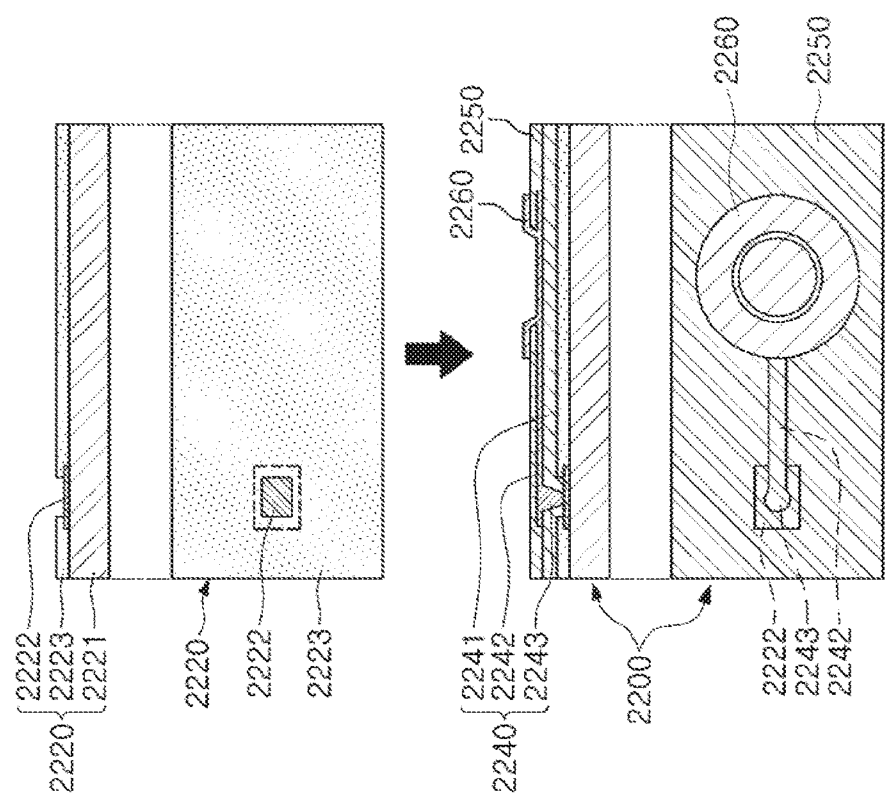

FIGS. 3A and 3B are schematic cross-sectional views illustrating states of a fan-in semiconductor package before and after being packaged.

Figure 4:
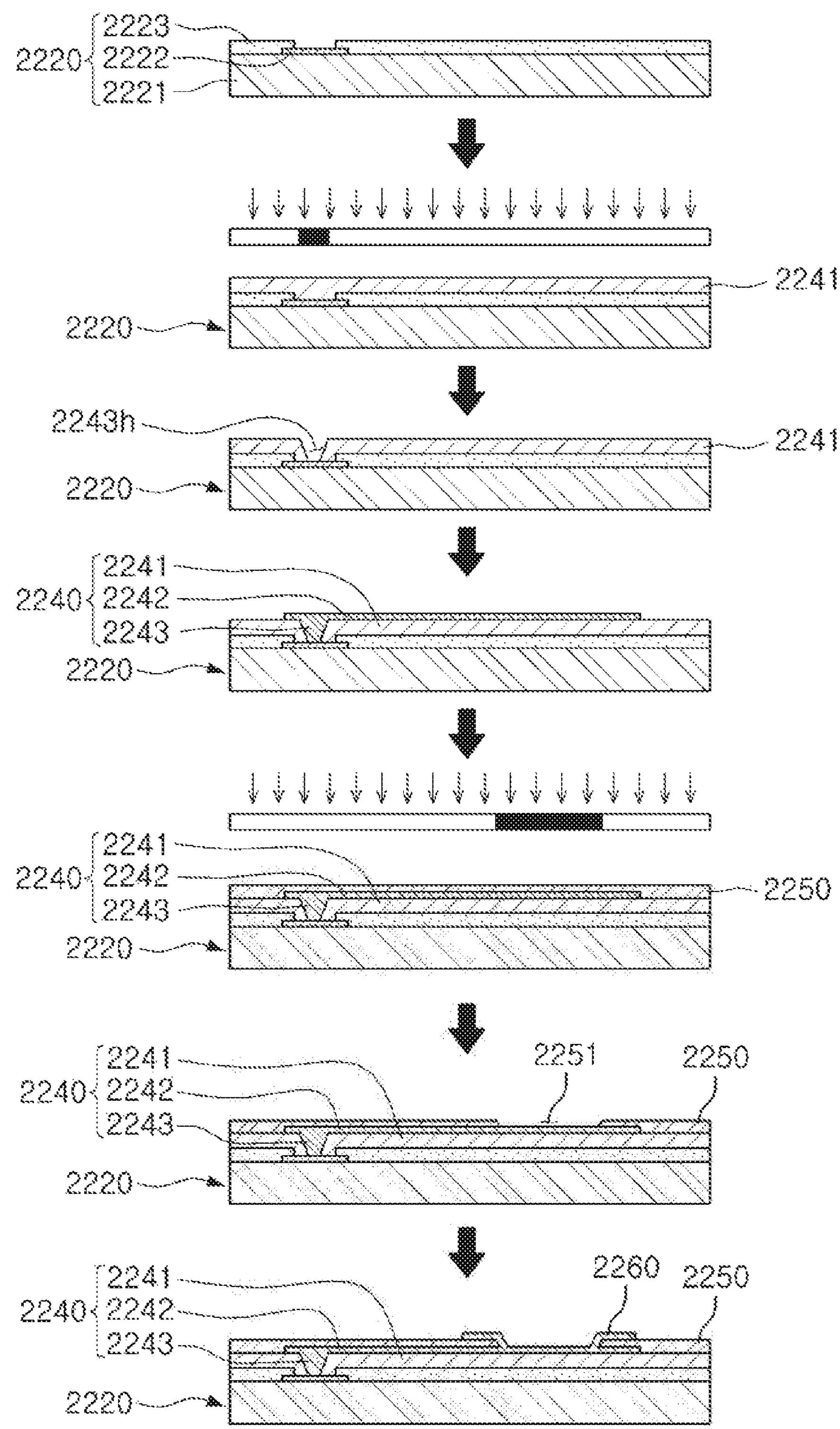
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A through 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
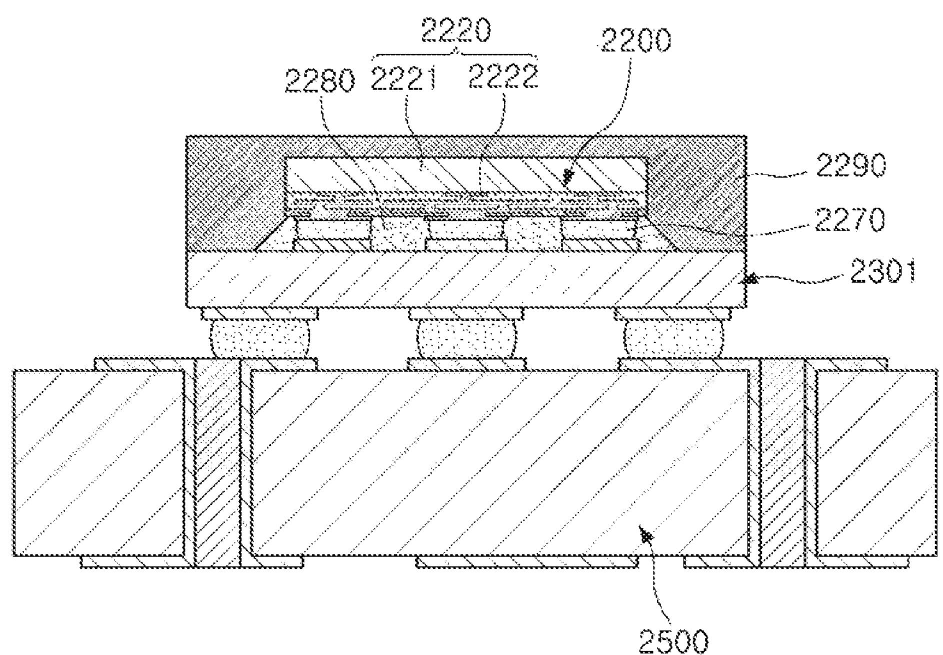
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
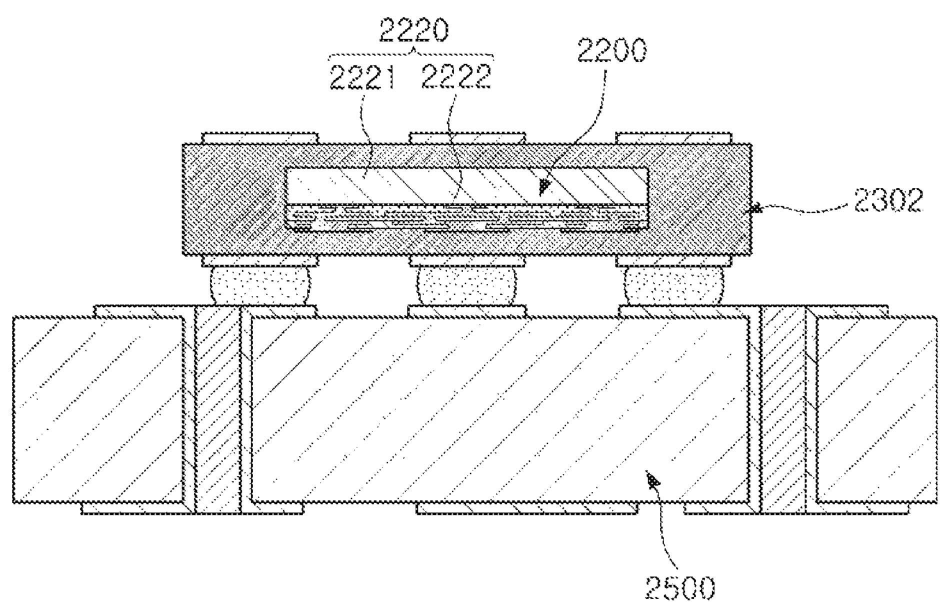
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-out Semiconductor Package

Figure 7:
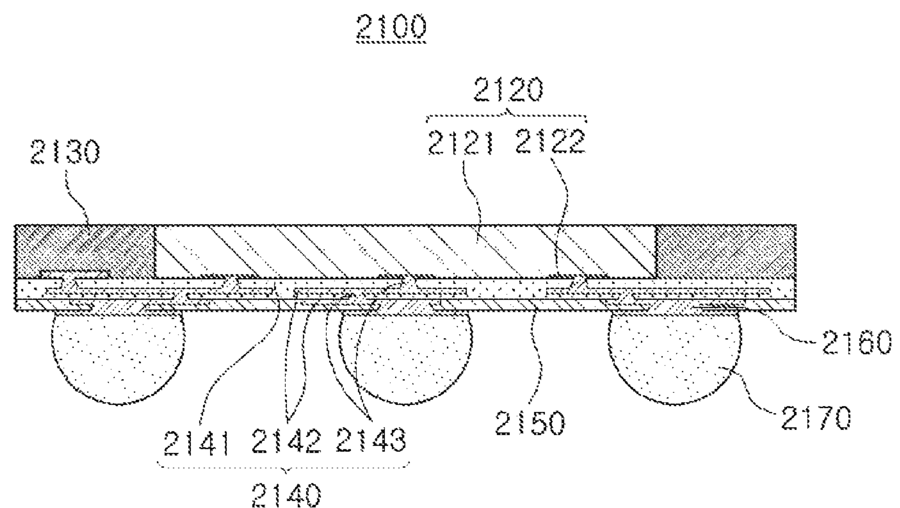
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
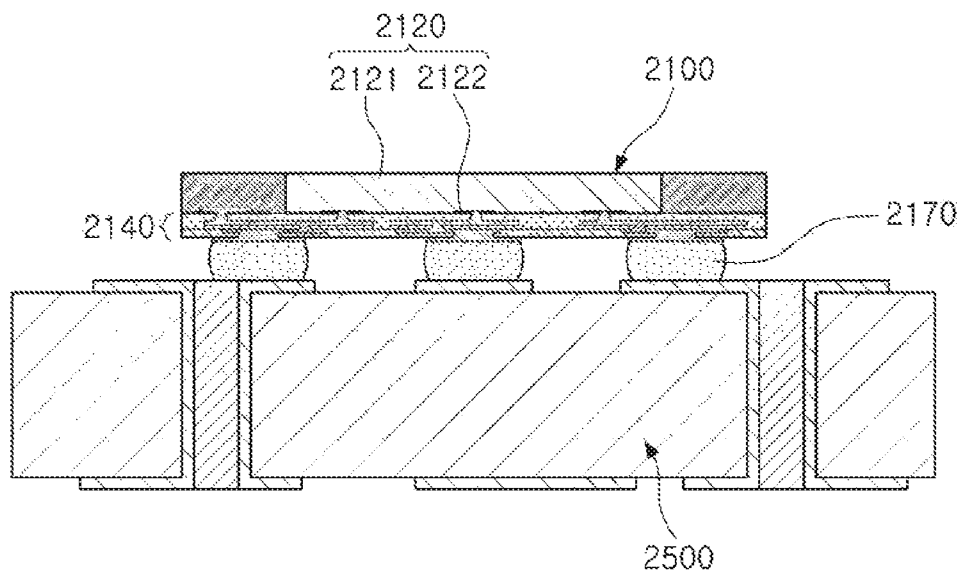
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
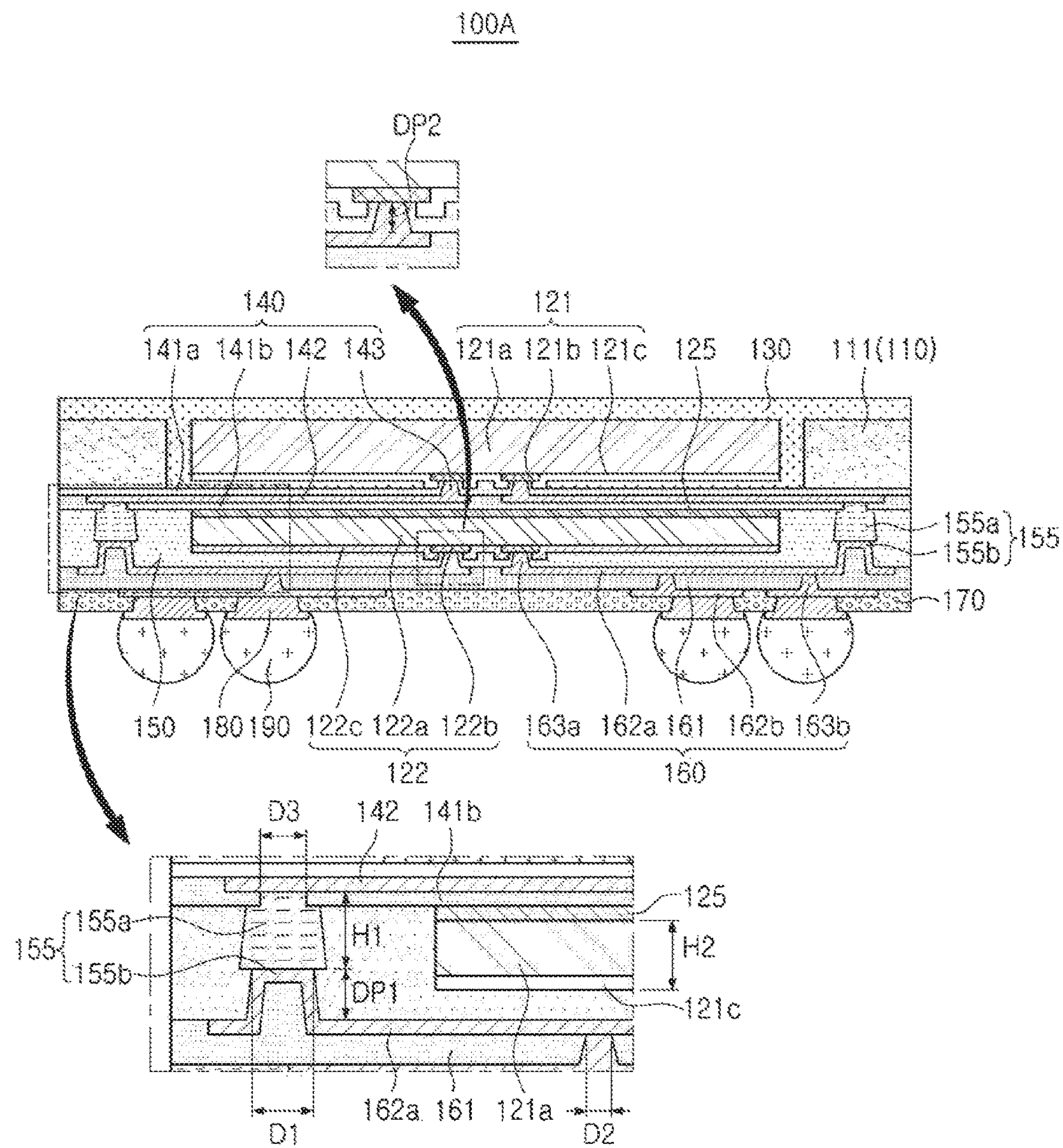
FIG. 9 is a schematic cross-sectional view illustrating an example of a fan-out semiconductor package.

FIG. 9 is a schematic cross-sectional view illustrating an example of a fan-out semiconductor package.

Referring to FIG. 9, a fan-out semiconductor package 100A according to an exemplary embodiment in the present disclosure may include a first semiconductor chip 121 having an active surface having first connection pads 121*b* disposed thereon and an inactive surface opposing the active surface, a first encapsulant 130 encapsulating at least portions of the first semiconductor chip 121, a first connection member 140 disposed on the active surface of the first semiconductor chip 121 and including first vias 143 and a first redistribution layer 142 electrically connected to the first connection pads 121*b* through the first vias 143, a second semiconductor chip 122 attached to the other surface of the first connection member 140 opposing one surface of the first connection member 140 on which the first semiconductor chip 121 is disposed and having an active surface having second connection pads 122*b* disposed thereon and an inactive surface opposing the active surface, a second encapsulant 150 disposed on the other surface of the first connection member 140 opposing one surface of the first connection member 140 on which the first semiconductor chip 121 is disposed and encapsulating at least portions of the active surface of the second semiconductor chip 122, a second connection member 160 disposed on the active surface of the second semiconductor chip 122 and including second vias 163*a* and 163*b* and second redistribution layers 162*a* and 162*b* electrically connected to the second connection pads 122*b* through the second vias 163*a* and 163*b*, and third vias 155 penetrating through the second encapsulant 150 and electrically connecting the first redistribution layer 142 and the second redistribution layers 162*a* and 162*b* to each other.

Particularly, each of the third vias 155 may include a metal post 155*a* and a via conductor 155*b* that are stacked. The metal post 155*a* may be disposed on the first redistribution layer 142, and the via conductor 155*b* may be disposed on the metal post 155*a* and connect the metal post 155*a* and the second redistribution layer 162*a* to each other. The third vias 155 need to penetrate through an entire thickness of the second encapsulant 150 encapsulating the second semiconductor chip 122, and may thus have an entire thickness greater than that of the second semiconductor chip 122. Therefore, when each of the third vias 155 is formed to have a single via structure, a defect such as a void may occur in a plating process or a subsequent process of forming a second insulating layer 161. However, each of the third vias 155 is configured to have a stacked structure of the metal post 155*a* and the via conductor 155*b*, such that the first redistribution layer 142 and the second redistribution layers 162*a* and 162*b* may be electrically connected stably to each other regardless of thicknesses of the second encapsulant 150 and the second semiconductor chip 122, and the fan-out semiconductor package 100A may be manufactured without occurrence of the defect.

Meanwhile, recently, technology of stacking a plurality of memory chips in multiple stages in order to increase a capacity of a memory has been developed. For example, there may be technology of stacking a plurality of memory chips in two stages (or three stages), mounting the stacked memory chips on an interposer substrate, and then molding the stacked memory chips mounted on the interposer substrate using a molding material to be thus used in a package form. In this case, the stacked memory chips are electrically connected to the interposer substrate by bonding wires. However, in this structure, there is a limitation in thinness due to a significant thickness of the interposer substrate. In addition, when the interposer substrate is manufactured on the basis of silicon, a significant cost is required. In addition, when a reinforcing material holding the stacked memory chips is not separately included, a problem may occur in reliability due to warpage. Particularly, since the stacked memory chips are electrically connected to the interposer substrate through the bonding wires, such that inputs/outputs (I/Os) of the stacked memory chips are redistributed, a signal path is significantly long, such that signal loss may be frequently generated.

On the other hand, in the fan-out semiconductor package 100A according to the exemplary embodiment, a signal path is formed through vias rather than the bonding wires, and may thus be significantly reduced. Therefore, generation of signal loss may also be significantly reduced. That is, signal electrical characteristics may be improved. Particularly, each of the third vias 155 connecting the redistribution layers 142, 162*a*, and 162*b* formed on different layers to each other may be formed in the stacked structure of the metal post 155*a* and the via conductor 155*b*, resulting in improvement of reliability such as stable transmission of high-current signals, or the like. In addition, the first semiconductor chip 121 disposed at an upper portion as well as the second semiconductor chip 122 disposed at a lower portion may be packaged in a bare state. That is, the first and second connection pads 121*b* and 122*b* of the first and second semiconductor chips 121 and 122 may be disposed on central portions of the active surfaces of the first and second semiconductor chips 121 and 122, respectively. The reason is that the first semiconductor chip 121 may be connected to the first redistribution layer 142 of the first connection member 140 through the first vias 143 and the first redistribution layer 142 may be connected to the second redistribution layers 162*a* and 162*b* formed on the second encapsulant 150 through the third vias 155 penetrating through the second encapsulant 150. As described above, formation of redistribution layers in a chip state for redesigning the connection pads 121*b* and 122*b* of the semiconductor chips 121 and 122 is not required, and the connection pads 121*b* and 122*b* positioned at the centers of the semiconductor chips 121 and 122 for the purpose of the most efficient designs of the semiconductor chips 121 and 122 may be used in the fan-out semiconductor package 100A as they are without performing a separate change operation.

In addition, in the fan-out semiconductor package 100A according to the exemplary embodiment, the first connection member 140 including the first redistribution layer 142, the second connection member 160 disposed on the second encapsulant 150, or the like, may be formed, instead of an interposer substrate. Therefore, the redistribution layers 142, 162*a*, and 162*b* may be distributed to various positions, such that a thickness of the first connection member 140 may be significantly reduced, and a backside encapsulation thickness or a thickness of the stacked chips may also be significantly reduced. In addition, the inactive surface of the second semiconductor chip 122 may be attached to the first connection member 140 using an adhesion member 125 such as a die attach film (DAF), or the like, and the attached second semiconductor chip 122 may be encapsulated by the second encapsulant 150 to be thus effectively fixed, such that reliability may be improved.

Meanwhile, the fan-out semiconductor package 100A according to the exemplary embodiment may include a core member 110, and the first semiconductor chip 121 may be disposed in a through-hole 110H of the core member 110. In this case, warpage may be controlled through the core member 110, and reliability may thus be improved. In addition, the fan-out semiconductor package 100A may further include a passivation layer 170 disposed on the second encapsulant 150, an underbump metal layer 180 formed in openings of the passivation layer 170, and electrical connection structure 190 formed on the underbump metal layer 180.

The respective components included in the fan-out semiconductor package 100A according to the exemplary embodiment will hereinafter be described in more detail.

The first semiconductor chip 121 may be an integrated circuit (IC) provided in an amount of several hundred to several million or more elements integrated in a single chip. In this case, the IC may be a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like, but is not limited thereto. In addition, the abovementioned elements may also be combined with each other and be disposed.

The active surface of the first semiconductor chip 121 refers to a surface of the first semiconductor chip 121 on which the first connection pads 121*b* are disposed, and the inactive surface thereof refers to a surface opposing the active surface. The first semiconductor chip 121 may be formed on the basis of an active wafer. In this case, a base material of a body 121*a* may be silicon (Si), germanium (Ge), gallium arsenide (GaAs), or the like. Various circuits may be formed on the body 121*a*. The first connection pads 121*b* may electrically connect the first semiconductor chip 121 to other components, and a conductive material such as aluminum (Al), or the like, may be used as a material of each of the first connection pads 121*b*. A passivation layer 121*c* exposing the first connection pads 121*b* may be formed on the body 121*a*, and may be an oxide film, a nitride film, or the like, or a double layer of an oxide layer and a nitride layer. A lower surface of the first connection pad 121*b* may have a step with respect to a lower surface of the first encapsulant 130 through the passivation layer 121*c*, and a phenomenon that the first encapsulant 130 bleeds into the lower surface of the first connection pad 121*b* may thus be prevented to some degree. An insulating layer (not illustrated), and the like, may also be further disposed in other required positions.

The first encapsulant 130 may protect the core member 110, the first semiconductor chip 121, and the like. An encapsulation form of the first encapsulant 130 is not particularly limited, but may be a form in which the first encapsulant 130 surrounds at least portions of the first semiconductor chip 121. For example, the first encapsulant 130 may cover at least portions of the core member 110 and the inactive surface of the first semiconductor chip 121, and fill at least portions of spaces between walls of the through-hole 110H and side surfaces of the first semiconductor chip 121. Meanwhile, the first encapsulant 130 may fill the through-hole 110H to thus serve as an adhesive for fixing the first semiconductor chip 121 and reduce buckling of the first semiconductor chip 121 depending on certain materials. A material of the first encapsulant 130 is not particularly limited. For example, an insulating material may be used as the material of the first encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The first connection member 140 may redistribute the first connection pads 121*b* of the first semiconductor chip 121. Several tens to several hundreds of first connection pads 121*b* having various functions may be redistributed by the first connection member 140, and may be physically or electrically connected to other components through third vias 155 to be described below depending on the functions. The first connection member 140 may include an upper first insulating layer 141*a,* the first redistribution layer 142 disposed on the upper first insulating layer 141*a,* the first vias 143 penetrating through the upper first insulating layer 141*a* and connecting the first connection pads 121*b* to the first redistribution layer 142, and a lower first insulating layer 141*b* disposed on the upper first insulating layer 141*a* and covering at least portions of the first redistribution layer 142. Meanwhile, the numbers of first insulating layers 141*a* and 141*b,* first redistribution layers 142, first vias 143, and the like, constituting the first connection member 140 may be more than those described above.

An insulating material may be used as a material of each of the first insulating layers 141*a* and 141*b.* In this case, a photosensitive insulating material such as a photoimagable dielectric (PID) resin may also be used as the insulating material. That is, the first insulating layers 141*a* and 141*b* may be photosensitive insulating layers. When the first insulating layers 141*a* and 141*b* have photosensitive properties, the first insulating layers 141*a* and 141*b* may be formed to have a smaller thickness, and a fine pitch of the first vias 143 may be achieved more easily. The first insulating layers 141*a* and 141*b* may be photosensitive insulating layers including an insulating resin and an inorganic filler. When the first insulating layers 141*a* and 141*b* are multiple layers, the materials of the first insulating layers 141*a* and 141*b* may be the same as each other, and may also be different from each other, if necessary. When the first insulating layers 141*a* and 141*b* are the multiple layers, the first insulating layers 141*a* and 141*b* may be integrated with each other depending on a process, such that a boundary therebetween may also not be apparent. The number of insulating layers may be more than that illustrated in the drawing.

The first redistribution layer 142 may serve to substantially redistribute the first connection pads 121*b.* A material of the first redistribution layer 142 may be a conductive material such as copper (Cu), aluminum(Al), silver (Ag), tin (Sn), gold (Au), nickel (Ni), lead (Pb), titanium (Ti), or alloys thereof. The first redistribution layer 142 may perform various functions depending on a design of a corresponding layer. For example, the first redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layer 142 may include various pad patterns such as via pads, connection terminal pads, and the like. All of the first connection pads 121*b* connected to the first vias 143 may be redistributed outwardly of the first semiconductor chip 121, that is, to a fan-out region, through the first redistribution layer 142.

The first vias 143 may electrically connect the first redistribution layer 142, the first connection pads 121*b,* and the like, formed on different layers to each other, resulting in an electrical path in the fan-out sensor package 100A. A material of each of the first vias 143 may be a conductive material such as copper (Cu), aluminum (Al), silver (Ag), tin (Sn), gold (Au), nickel (Ni), lead (Pb), titanium (Ti), or alloys thereof. Each of the first vias 143 may be completely filled with the conductive material, or the conductive material may also be formed along a wall of each of via holes. In addition, each of the first vias 143 may have any shape known in the related art, such as a tapered shape, a cylindrical shape, and the like.

The core member 110 may improve rigidity of the fan-out semiconductor package 100A depending on certain materials, and serve to secure uniformity of a thickness of the first encapsulant 130. In addition, due to the core member 110, the fan-out semiconductor package 100A according to the exemplary embodiment may be used as a portion of a package-on-package. The core member 110 may have the through-hole 110H. The first semiconductor chip 121 may be disposed in the through-hole 110H to be spaced apart from the core member 110 by a predetermined distance. The side surfaces of the first semiconductor chip 121 may be surrounded by the core member 110. However, such a form is only an example and may be variously modified to have other forms, and the core member 110 may perform another function depending on such a form. The core member 110 may be omitted, if necessary, but it may be more advantageous in securing board level reliability intended in the present disclosure that the fan-out semiconductor package 100A includes the core member 110.

The core member 110 may include a core insulating layer 111. An insulating material may be used as a material of the core insulating layer 111. In this case, the insulating material may be a thermosetting resin such as an epoxy resin, a thermoplastic resin such as a polyimide resin, an insulating material in which the thermosetting resin or the thermoplastic resin is impregnated in an inorganic filler and/or a core material such as a glass fiber (or a glass cloth or a glass fabric), for example, prepreg, ABF, FR-4, BT, or the like. The core member 110 may serve as a support member.

The second semiconductor chip 122 may also be an integrated circuit (IC) provided in an amount of several hundred to several million or more elements integrated in a single chip. The IC may be a memory chip such as a volatile memory (such as a DRAM), a non-volatile memory (such as a ROM), a flash memory, or the like, but is not limited thereto. The active surface of the second semiconductor chip 122 refers to a surface of the second semiconductor chip 121 on which the second connection pads 122*b* are disposed, and the inactive surface thereof refers to a surface opposing the active surface. The second semiconductor chip 122 may be formed on the basis of an active wafer. In this case, a base material of a body 122*a* may be silicon (Si), germanium (Ge), gallium arsenide (GaAs), or the like. Various circuits may be formed on the body 122*a.* The second connection pads 122*b* may electrically connect the second semiconductor chip 122 to other components, and a conductive material such as aluminum (Al), or the like, may be used as a material of each of the second connection pads 122*b.* A passivation layer 122*c* exposing the second connection pads 122*b* may be formed on the body 122*a,* if necessary, and may be an oxide film, a nitride film, or the like, or a double layer of an oxide layer and a nitride layer. An insulating layer (not illustrated), and the like, may also be further disposed in other required positions.

The adhesion member 125 may easily attach the inactive surface of the second semiconductor chip 122 to the lower first insulating layer 141*b* of the first connection member 140. The adhesion member 125 may be any known tape such as a die attach film (DAF). A material of the adhesion member 125 is not particularly limited. The adhesion member 125 may include, for example, an epoxy component, but is not limited thereto. The second semiconductor chip 122 may be more stably mounted through the adhesion member 125, and reliability may thus be improved.

The second encapsulant 150 may protect the second semiconductor chip 122. An encapsulation form of the second encapsulant 150 is not particularly limited, but may be a form in which the second encapsulant 150 surrounds at least portions of the second semiconductor chip 122. For example, the second encapsulant 150 may cover at least portions of the active surface of the second semiconductor chip 122, and also cover at least portions of side surfaces of the second semiconductor chip 122. The second encapsulant 150 may include an insulating material. The insulating material may be a photoimagable epoxy (PIE), a PID, or the like. However, the insulating material is not limited thereto. That is, a material including an inorganic filler and an insulating resin, for example, a thermosetting resin such as an epoxy resin, a thermoplastic resin such as a polyimide resin, or a resin having a reinforcing material such as an inorganic filler impregnated in the thermosetting resin and the thermoplastic resin, more specifically, ABF, or the like, may be used as the insulating material. In addition, any known molding material such as an EMC, or the like, may also be used. Alternatively, a material in which a thermosetting resin or a thermoplastic resin is impregnated in an inorganic filler and/or a core material such as a glass fiber (or a glass cloth or a glass fabric) may also be used as the insulating material.

The second connection member 160 may redistribute the second connection pads 122*b* of the second semiconductor chip 122. Several tens to several hundreds of second connection pads 122*b* having various functions may be redistributed by the second connection member 160, and may be physically or electrically connected to other components through the third vias 155 depending on the functions. The connection member 160 may include an upper second redistribution layer 162*a* disposed on the second encapsulant 150, upper second vias 163*a* penetrating through the second encapsulant 150 and connecting the second connection pads 122*b* to the upper second redistribution layer 162*a*, a second insulating layer 161 disposed on the second encapsulant 150, a lower second redistribution layer 162*b* disposed on the second insulating layer 161, and lower second vias 163*b* penetrating through the second insulating layer 161 and connecting the upper second redistribution layer 162*a* and the lower second redistribution layer 162*b* to each other. The second redistribution layers 162*a* and 162*b* may be electrically connected to the second connection pads 122*b* of the second semiconductor chip 122. Meanwhile, the numbers of second insulating layers 161, second redistribution layers 162*a* and 162*b*, second vias 163*a* and 163*b*, and the like, constituting the second connection member 160 may be more than those described above.

A material of the second insulating layer 161 may be an insulating material. In this case, a photosensitive insulating material such as a PID resin may also be used as the insulating material. That is, the second insulating layer 161 may be a photosensitive insulating layer. When the second insulating layer 161 has photosensitive properties, the second insulating layer 161 may be formed to have a smaller thickness, and a fine pitch of the lower second vias 163*b* may be achieved more easily. The second insulating layer 161 may be a photosensitive insulating layer including an insulating resin and an inorganic filler.

The second redistribution layers 162*a* and 162*b* may serve to substantially redistribute the second connection pads 122*b*.

A material of each of the second redistribution layers 162*a* and 162*b* may be a conductive material such as copper (Cu), aluminum (Al), silver (Ag), tin (Sn), gold (Au), nickel (Ni), lead (Pb), titanium (Ti), or alloys thereof. The second redistribution layers 162*a* and 162*b* may perform various functions depending on designs of corresponding layers. For example, the second redistribution layers 162*a* and 162*b* may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layers 162*a* and 162*b* may include various pad patterns such as via pads, connection terminal pads, and the like.

The second vias 163*a* and 163*b* may electrically connect the second redistribution layers 162*a* and 162*b*, the second connection pads 122*b*, and the like, formed on different layers to each other, resulting in an electrical path in the fan-out sensor package 100A. A material of each of the second vias 163*a* and 163*b* may be a conductive material such as copper (Cu), aluminum (Al), silver (Ag), tin (Sn), gold (Au), nickel (Ni), lead (Pb), titanium (Ti), or alloys thereof. Each of the second vias 163*a* and 163*b* may be completely filled with the conductive material, or the conductive material may also be formed along a wall of each of via holes. In addition, each of the second vias 163*a* and 163*b* may have any shape known in the related art, such as a tapered shape, a cylindrical shape, and the like. However, the second vias 163*a* and 163*b* may have a reverse tapered shape of which a lower diameter is greater than an upper diameter, and it may be advantageous in a process that the second vias 163*a* and 163*b* have such a shape.

The third vias 155 may electrically connect the first and second redistribution layers 142, 162*a*, and 162*b* formed on different layers to each other, resulting in an electrical path. The third vias 155 may be disposed in a region outside the first and second semiconductor chips 121 and 122. Particularly, the third vias 155 may be disposed at at least one side of the second semiconductor chip 122, may penetrate through the second encapsulant 150, and may also penetrate through the lower first insulating layer 141*b* of the first connection member 140. Each of the third vias 155 may include the metal post 155*a* and the via conductor 155*b*. Both of the metal post 155*a* and the via conductor 155 may be disposed in the second encapsulant 150, which is one insulating layer.

The metal post 155*a* may be disposed on the first redistribution layer 142. The metal post 155*a* may be, for example, a copper (Cu) post, but is not limited thereto. The metal post 155*a* may have a cylindrical shape or have a reverse tapered shape of which a lower diameter is greater than an upper diameter, but is not limited thereto. The metal post 155*a* may have a step formed due to a reduced width on a boundary between the metal post 155*a* and the lower first insulating layer 141*b*. However, in other exemplary embodiments, the step may also be omitted. A height H1 of the metal post 155*a* may be similar to or smaller than a height H2 of the second semiconductor chip 122. For example, the height H1 of the metal post 155*a* may be in a range of approximately 40 μm to 120 μm. A lower surface of the metal post 155a may be disposed on a level above or similar to a lower surface of the second semiconductor chip 122. The thickness (or the height H1) of the metal post 155a may be greater than that of the via conductor 155b disposed on the metal post 155a or disposed on the walls of the second encapsulant 150. A depth DP1 from a lower surface of the second encapsulant 150 to the lower surface of the metal post 155a may be similar to or greater than a depth DP2 from the lower surface of the second encapsulant 150 to the second connection pad 122b.

The via conductor 155b may be disposed on the metal post 155a, and may connect the metal post 155a and the upper second redistribution layer 162a to each other. A material of the via conductor 155b may be a conductive material such as copper (Cu), aluminum (Al), silver (Ag), tin (Sn), gold (Au), nickel (Ni), lead (Pb), titanium (Ti), or alloys thereof. The via conductors 155b may be formed at a predetermined thickness along walls of via holes penetrating through the second encapsulant 150 and the lower surfaces of the metal posts 155a using the conductive material, and spaces between the via conductors 155b of the via holes may be filled with the second insulating layer 161. The via conductor 155b may have a tapered shape of which a lower diameter is greater than an upper diameter, and it may be advantageous in a process that the via conductor 155b has such a shape. A diameter D1 of an upper surface of the via conductor 155b may be greater than a diameter D2 of an upper surface of each of the second vias 163a and 163b, and may also be greater than that of the first via 143. The diameter D1 of the upper surface of the via conductor 155b may be equal to, or less than a diameter of a lower surface of the metal post 155a. In addition, a length of a long side in a cross-section of the via conductor 155b may be greater than that of a long side in a cross-section of each of the second vias 163a and 163b on any level. Here, the length of the long side means the longest distance of distances between two points at which any straight lines passing through the center of the cross-section meet an outer edge of the cross-section, respectively, in each horizontal cross-section. In addition, the diameter D1 of the upper surface of the via conductor 155b may be greater than a diameter D3 of an upper surface of the metal post 155a. An entire height of the third via 155 may be greater than the height H2 of the second semiconductor chip 122.

The passivation layer 170 may protect the second connection member 160 from external physical or chemical damage, or the like. The passivation layer 170 may have the openings exposing at least portions of the lower second redistribution layer 162b of the second connection member 160. The number of openings formed in the passivation layer 170 may be several tens to several thousands. A material of the passivation layer 170 is not particularly limited. For example, an insulating material may be used as the material of the passivation layer 170. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layer 180 may improve connection reliability of the electrical connection structures 190 to improve board level reliability of the fan-out semiconductor package 100A. The underbump metal layer 180 may be connected to the lower second redistribution layer 162b of the second connection member 160 exposed through the openings of the passivation layer 170. The underbump metal layer 180 may be formed in the openings of the passivation layer 170 by any known metallization method using any known conductive material such as a metal, but is not limited thereto.

The electrical connection structure 190 may physically or electrically externally connect the fan-out semiconductor package 100A. For example, the fan-out semiconductor package 100A may be mounted on the mainboard of the electronic device through the electrical connection structures 190. Each of the electrical connection structures 190 may be formed of a conductive material, for example, a solder, or the like. However, this is only an example, and a material of each of the electrical connection structures 190 is not particularly limited thereto. Each of the electrical connection structures 190 may be a land, a ball, a pin, or the like. The electrical connection structures 190 may be formed as a multilayer or single layer structure. When the electrical connection structures 190 are formed as a multilayer structure, the electrical connection structures 190 may include a copper (Cu) pillar and a solder. When the electrical connection structures 190 are formed as a single layer structure, the electrical connection structures 190 may include a tin-silver solder or copper (Cu). However, this is only an example, and the electrical connection structures 190 are not limited thereto.

The number, an interval, a disposition form, and the like, of electrical connection structures 190 are not particularly limited, but may be sufficiently modified depending on design particulars by those skilled in the art. For example, the electrical connection structures 190 may be provided in an amount of several tens to several thousands according to the numbers of first and second connection pads 121b and 122b, or may be provided in an amount of several tens to several thousands or more or several tens to several thousands or less. When the electrical connection structures 190 are solder balls, the electrical connection structures 190 may cover side surfaces of the underbump metal layer 180 extending onto one surface of the passivation layer 170, and connection reliability may be more excellent.

At least one of the electrical connection structures 190 may be disposed in a fan-out region. The fan-out region refers to a region except for a region in which the first and second semiconductor chips 121 and 122 are disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the through-hole 110H, if necessary, in order to dissipate heat or block electromagnetic waves. In addition, a plurality of semiconductor chips performing functions that are the same as or different from each other may be disposed in the through-hole 110H, if necessary. In addition, a separate passive component such as an inductor, a capacitor, or the like, may be disposed in the through-hole 110H, if necessary. In addition, a passive component, for example, a surface mounting technology (SMT) component including an inductor, a capacitor, or the like, may be disposed on a surface of the passivation layer 170, if necessary.

FIGS. 10A through 10M are schematic views illustrating an example of processes of manufacturing the fan-out semiconductor package of FIG. 9.

Referring to FIG. 10A, the core member 110 may be prepared. The core member 110 may include the core insulating layer 111. The core insulating layer 111 may be an unclad copper clad laminate (CCL), or the like, but is not limited thereto.

Referring to FIG. 10B, the through-hole 110H may be formed in the core member 110. The through-hole 110H may be formed using a mechanical drill, a laser drill, or the like, but is not limited thereto. After the through-hole 110H is formed, a desmear process, or the like, may be additionally performed.

Referring to FIG. 10C, the first semiconductor chip 121 may be disposed in a face-down form in the through-hole 110H of the core member 110, and may be encapsulated by the first encapsulant 130. An adhesive film (not illustrated), or the like, may be used to dispose the first semiconductor chip 121. For example, a method of attaching the adhesive film (not illustrated) to the core member 110, attaching the first semiconductor chip 121 to the adhesive film (not illustrated) exposed through the through-hole 110H, forming the first encapsulant 130 by any known lamination method or coating method, and then removing the adhesive film (not illustrated) may be used.

Figure 10D:
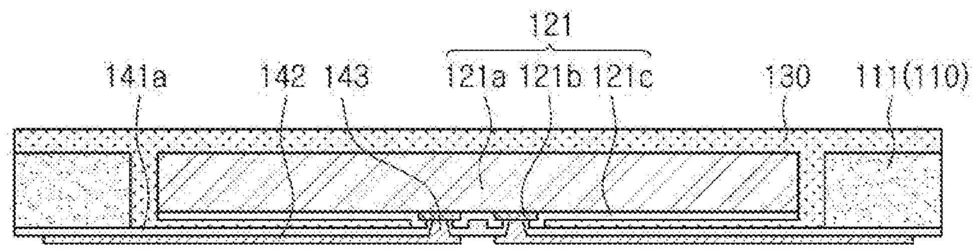

Referring to FIG. 10D, the upper first insulating layer 141*a*, the first redistribution layer 142, and the first vias 143 may be formed on the core member 110 and the active surface of the first semiconductor chip 121.

The upper first insulating layer 141*a* may also be formed by laminating or applying a PID, or the like. Then, via holes penetrating through the upper first insulating layer 141*a* may be formed. The via holes may be formed by a photolithography method such as exposure, development, and the like. The first redistribution layer 142 and the first vias 143 may be formed by forming patterns using a dry film, or the like, and then filling the patterns by a plating process. The plating process may be a subtractive process, an additive process, a semi-additive process (SAP), a modified semi-additive process (MSAP), or the like, but is not limited thereto.

Figure 10E:
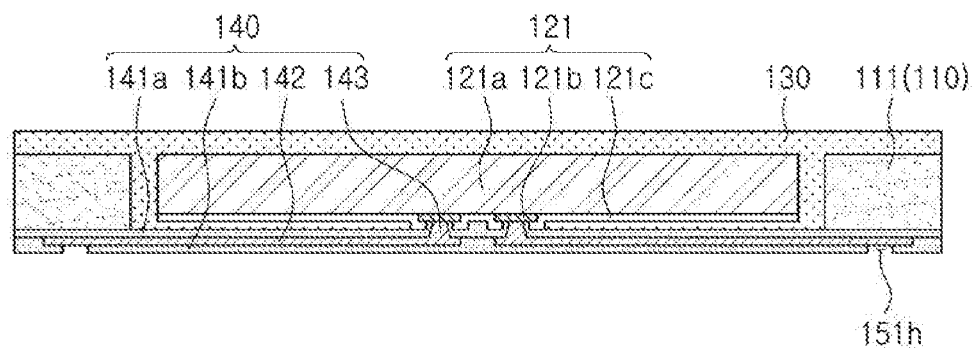

Referring to FIG. 10E, the lower first insulating layer 141*b* may be formed on the upper first insulating layer 141*a*, and via holes 151*h* penetrating through the lower first insulating layer 141*b* may be formed.

The lower first insulating layer 141*b* may also be formed by laminating or applying a PID, or the like. Resultantly, the first connection member 140 may be formed. Then, via holes 151*h* penetrating through the lower first insulating layer 141*b* and exposing the first redistribution layer 142 may be formed by a photolithography method such as exposure, development, and the like.

Figure 10F:
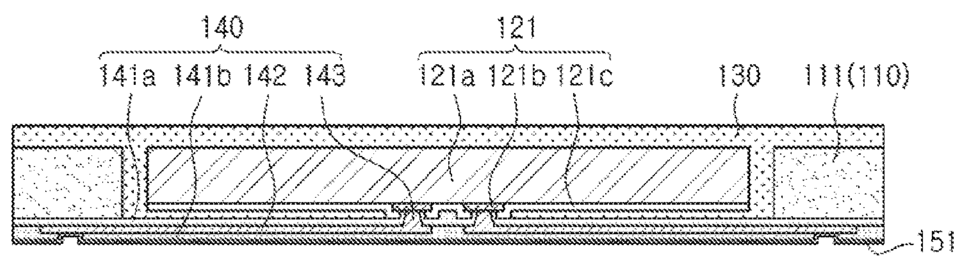

Referring to FIG. 10F, a seed metal layer 151 may be formed on the lower first insulating layer 141*b*. The seed metal layer 151 may be formed on the first redistribution layer 142 exposed in the via holes 151*h*, and extend onto the lower first insulating layer 141*b*. The seed metal layer 151 may be used as a seed layer of a subsequent plating process. The seed metal layer 151 may be formed of, for example, copper (Cu), silver (Ag), or alloys thereof. The seed metal layer 151 may be formed by sputtering, chemical vapor deposition (CVD), or the like, but is not limited thereto.

Figure 10G:
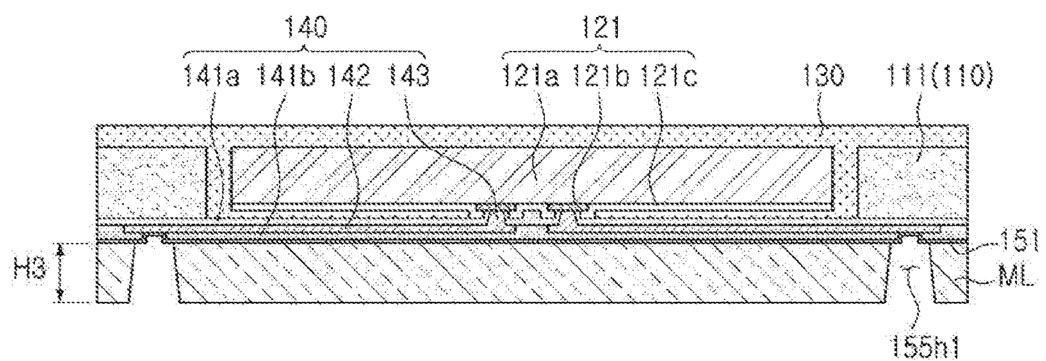

Referring to FIG. 10G, a photoresist pattern ML having via holes 155*h*1 may be formed on the seed metal layer 151. The photoresist pattern ML may be formed of a photosensitive film, and may be, for example, a dry film photoresist (DRF). The photoresist pattern ML may be formed by forming a photoresist layer by a lamination method, a coating method, or the like, and then forming the via holes 155*h*1 in the photoresist layer by a photolithography process. The via holes 155*h*1 may be formed to expose regions including regions in which the seed metal layer 151 and the first redistribution layer 142 are in contact with each other. A thickness H3 of the photoresist pattern ML may be the same as or greater than a thickness H1*a* of a metal post 155*a* to be formed on the lower first insulating layer 141*b* in a subsequent process.

Figure 10H:
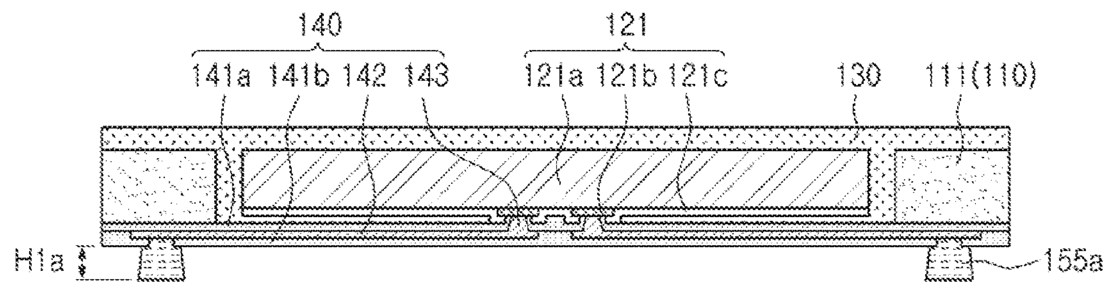

Referring to FIG. 10H, the metal posts 155*a* may be formed by a plating process. After the metal posts 155*a* are formed, the photoresist pattern ML may be peeled off and removed, and the exposed seed metal layer 151 may be etched and removed. Therefore, the metal post 155*a* may include the seed metal layer 151 disposed at an upper end thereof, but a boundary between the metal post 155*a* and the seed metal layer 151 may be apparent or may not be apparent.

Figure 10I:
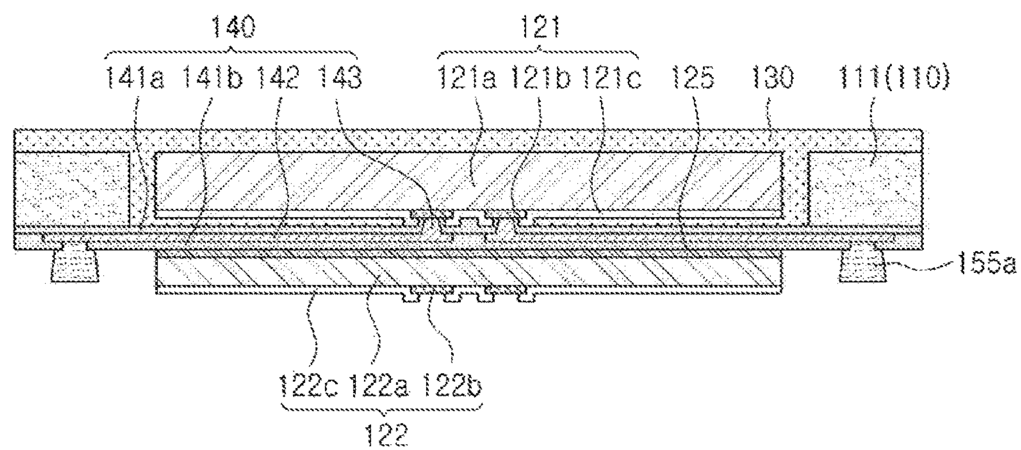
Figure 10J:
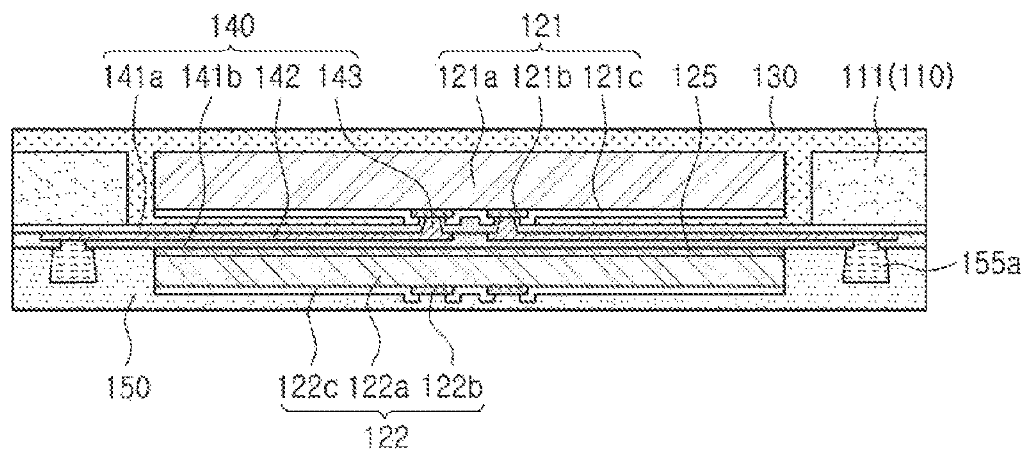

Referring to FIG. 10I, the second semiconductor chip 122 may be attached to the lower first insulating layer 141*b* using the adhesion member 125, or the like. The second semiconductor chip 122 may be disposed side-by-side with the metal posts 155*a*.

Referring to 10J, the second encapsulant 150 encapsulating at least portions of the second semiconductor chip 122 may be formed by any known lamination method, coating method, or the like.

Figure 10K:
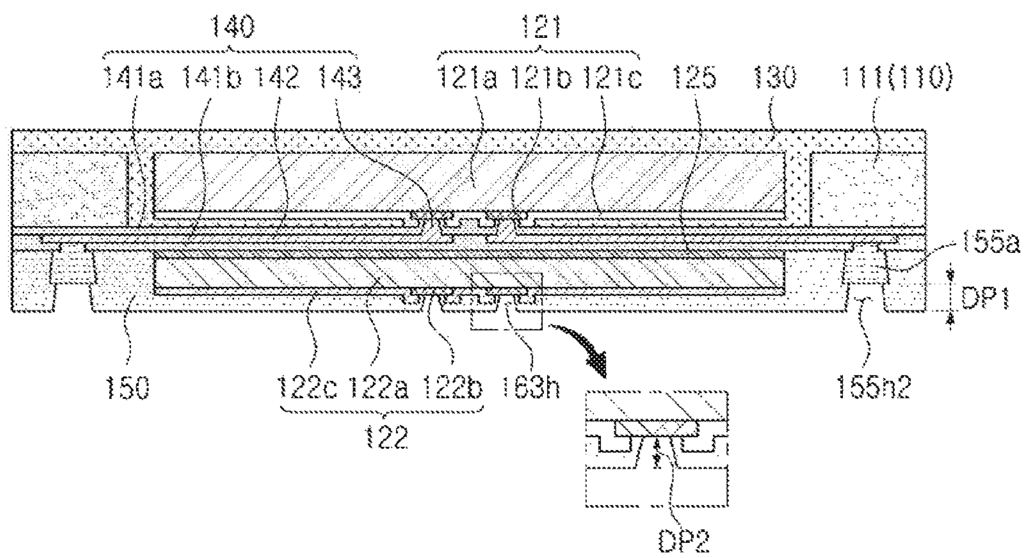

Referring to FIG. 10K, via holes 155*h*2 penetrating through portions of the second encapsulant 150 and exposing the metal posts 155*a* may be formed. In addition, via holes 163*h* penetrating through portions of the second encapsulant 150 and exposing the second connection pads 122*b* may be formed. These via holes 155*h*2 and 163*h* may be formed by a photolithography method using exposure and development. However, the via holes 155*h*2 and 163*h* may also be formed using a mechanical drill, a laser drill, or the like, depending on a material of the second encapsulant 150. A depth DP1 from the lower surface of the second encapsulant 150 to the metal post 155*a* exposed by the via hole 155*h*2 may be similar to or greater than a depth DP2 from the lower surface of the second encapsulant 150 to the second connection pad 122*b* exposed by the via hole 163*h*. The via holes 155*h*2 and 163*h* are formed together, and it may thus be advantageous in forming the via holes 155*h*2 and 163*h* that a difference between the depths DP1 and DP2 is not large. Therefore, when the metal posts 155*a* are formed, the metal posts 155*a* may be formed at a selected height in consideration of the difference between the depths DP1 and DP2 of the via holes 155*h*2 and 163*h*, sizes of the via holes 155*h*2 and 163*h*, and the like. Since the via holes 155*h*2 are formed to expose the metal posts 155*a*, a depth of the second encapsulant 150 that needs to be developed may be reduced as compared to a structure in which the metal posts 155*a* do not exist. Therefore, a defect due to non-development in the present process may be prevented.

Figure 10L:
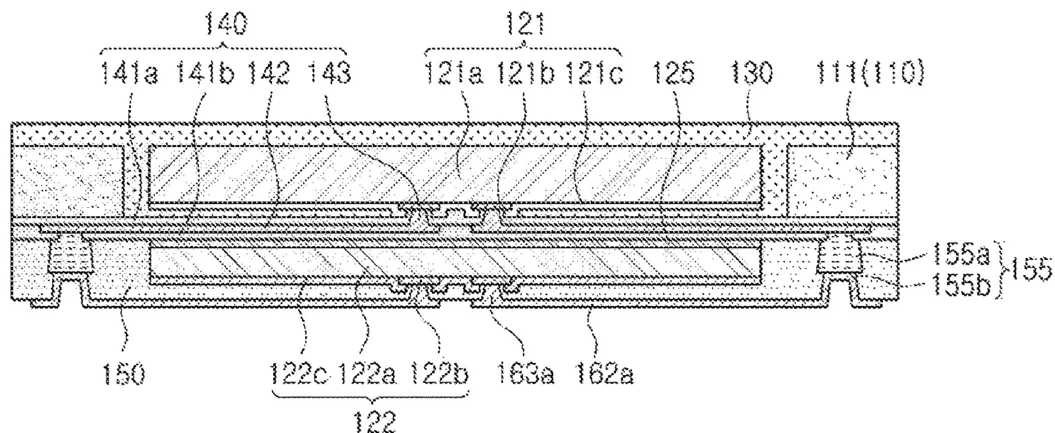

Referring to FIG. 10L, the upper second redistribution layer 162*a*, the upper second vias 163*a*, and the via conductors 155*b* may be formed. The upper second redistribution layer 162*a*, the upper second vias 163*a*, and the via conductors 155*b* may be formed by forming patterns using a dry film, or the like, and then filling the patterns by a plating process. The plating process may be a subtractive process, an additive process, a semi-additive process (SAP), a modified semi-additive process (MSAP), or the like, but is not limited thereto. In the present process, the third vias 155 including the metal posts 155*a* and the via conductors 155*b* may be formed. Since the via conductors 155*b* are disposed on the metal posts 155*a*, a plating depth may be reduced in the present plating process. Therefore, occurrence of a defect such as a void in the plating process may be prevented. Since the metal post 155*a* and the via conductor 155*b* are formed by two different processes, a same conductive material or different conductive materials may be selected to form the metal post 155*a* and the via conductor 155*b*.

Figure 10M:
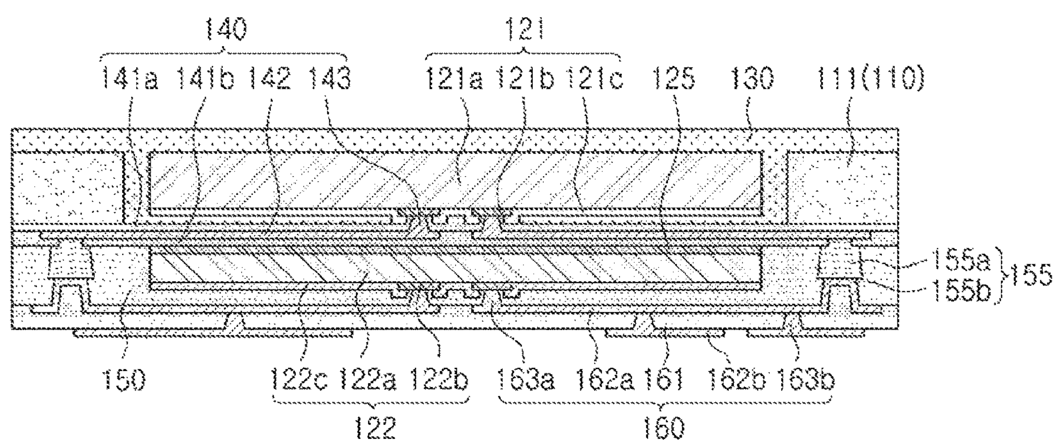

Referring to FIG. 10M, the second insulating layer 161 may be formed on the upper second redistribution layer 162*a*, and the lower second redistribution layer 162*b* and the lower second vias 163*b* may be formed.

The second insulating layer 161 may also be formed by laminating or applying a PID, or the like. Since a depth of a space between the via conductors 155*b* is reduced as compared to a case in which the metal posts 155*a* do not exist, a defect occurring since the second insulating layer 161 is not completely embedded when the second insulating layer 161 is formed may be prevented. Then, via holes penetrating through the second insulating layer 161 and exposing the upper second redistribution layer 162*a* may be formed by a photolithography method such as exposure, development, and the like. The via holes may be formed by a photolithography method such as exposure, development, and the like. The lower second redistribution layer 162*b* and the lower second vias 163*b* may be formed by forming patterns using a dry film, or the like, and then filling the patterns by a plating process. Resultantly, the second connection member 160 may be formed.

Then, referring to FIG. 9, the passivation layer 170, the underbump metal layer 180, and the electrical connection structures 190 may be sequentially formed. The passivation layer 170 may be formed by any known lamination or hardening method, the underbump metal layer 180 may be formed by any known metallization method, and the electrical connection structures 190 may be formed by a reflow process, or the like.

Meanwhile, a series of processes may be processes of preparing the core member 110 having a large size, manufacturing a plurality of fan-out semiconductor packages, and then singulating the plurality of fan-out semiconductor packages into individual fan-out semiconductor packages through a sawing process in order to facilitate mass production. In this case, productivity may be excellent.

Figure 11:
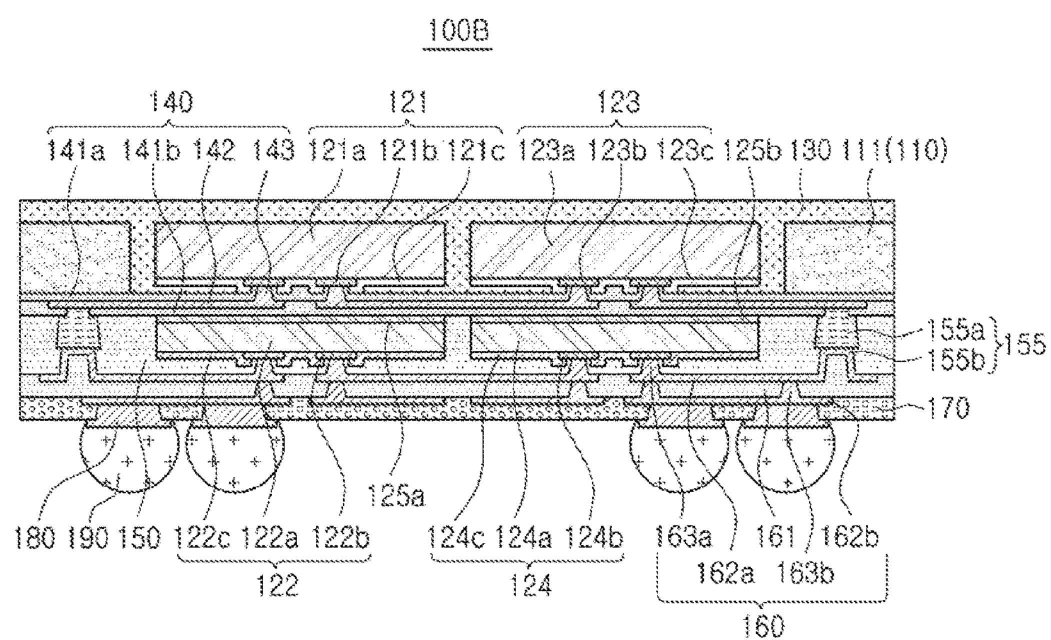
FIG. 11 is a schematic cross-sectional view illustrating another example of a fan-out semiconductor package.

FIG. 11 is a schematic cross-sectional view illustrating another example of a fan-out semiconductor package.

Referring to FIG. 11, in a fan-out semiconductor package 100B according to another exemplary embodiment in the present disclosure, first and third semiconductor chips 121 and 123 may be disposed side-by-side in a through-hole 110H of a core member 110. The first and third semiconductor chips 121 and 123 may have first and third connection pads 121*b* and 123*b*, respectively, and the first and third connection pads 121*b* and 123*b* may be redistributed by a first redistribution layer 142 of a first connection member 140. In addition, second and fourth semiconductor chips 122 and 124 may be attached side-by-side to the first connection member 140 using first and second adhesion members 125*a* and 125*b*, and the like, respectively. The second and fourth semiconductor chips 122 and 124 may have second and fourth connection pads 122*b* and 124*b*, respectively, and the second and fourth connection pads 122*b* and 124*b* may be redistributed by second redistribution layers 162*a* and 162*b* of a second connection member 160 formed on a second encapsulant 150. Passivation layers 123*c* and 124*c*, and the like, may be disposed on active surfaces of the third and fourth semiconductor chips 123 and 124, respectively. A description of other configurations and a manufacturing method overlaps that described above, and is thus omitted.

Figure 12:
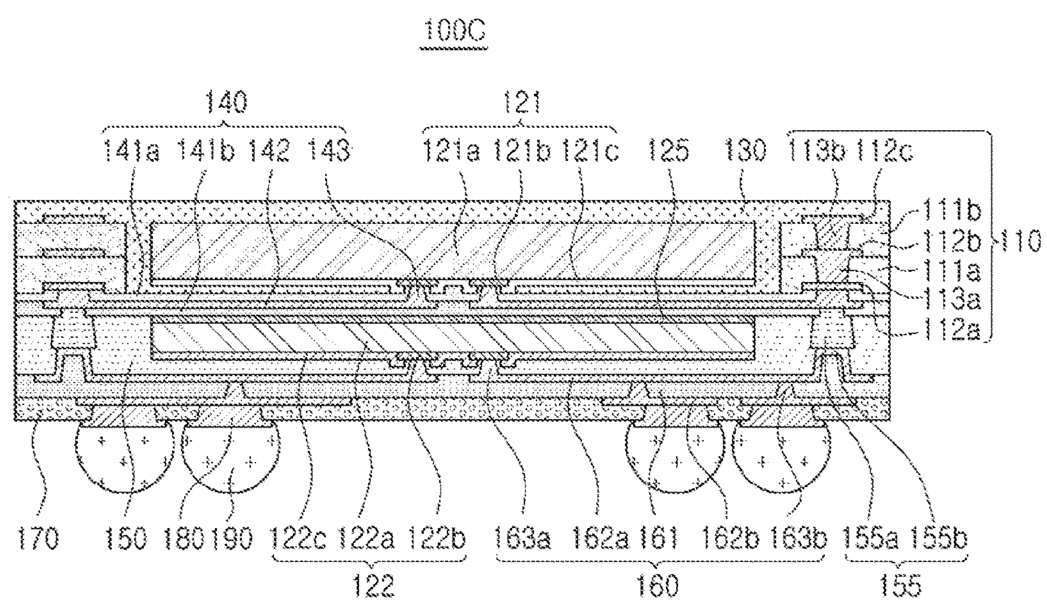
FIG. 12 is a schematic cross-sectional view illustrating another example of a fan-out semiconductor package.

FIG. 12 is a schematic cross-sectional view illustrating another example of a fan-out semiconductor package.

Referring to FIG. 12, in a fan-out semiconductor package 100C according to another exemplary embodiment in the present disclosure, a first core member 110 may include a first core insulating layer 111*a* in contact with a first connection member 140, a first wiring layer 112*a* in contact with the first connection member 140 and embedded in the first core insulating layer 111*a*, a second wiring layer 112*b* disposed on the other surface of the first core insulating layer 111*a* opposing one surface of the first core insulating layer 111*a* in which the first wiring layer 112*a* is embedded, a second core insulating layer 111*b* disposed on the first core insulating layer 111*a* and covering the second wiring layer 112*b*, and a third wiring layer 112*c* disposed on the second core insulating layer 111*b*. The first to third wiring layers 112*a*, 112*b*, and 112*c* may be electrically connected to first connection pads 121*b*. The first and second wiring layers 112*a* and 112*b* and the second and third wiring layers 112*b* and 112*c* may be electrically connected to each other through first and second vias 113*a* and 113*b* penetrating through the first and second core insulating layers 111*a* and 111*b*, respectively.

When the first wiring layer 112*a* is embedded in the first core insulating layer 111*a*, a step generated due to a thickness of the first wiring layer 112*a* may be significantly reduced, and an insulating distance of the first connection member 140 may thus become constant. That is, a difference between a distance from a first redistribution layer 142 of the first connection member 140 to a lower surface of the first core insulating layer 111*a* and a distance from the first redistribution layer 142 of the first connection member 140 to the first connection pad 121*b* of a first semiconductor chip 121 may be smaller than a thickness of the first wiring layer 112*a*. Therefore, a high density wiring design of the first connection member 140 may be easy.

A lower surface of the first wiring layer 112*a* of the core member 110 may be disposed on a level above a lower surface of the first connection pad 121*b* of the first semiconductor chip 121. In addition, a distance between the first redistribution layer 142 of the first connection member 140 and the first wiring layer 112*a* of the core member 110 may be greater than that between the first redistribution layer 142 of the first connection member 140 and the first connection pad 121*b* of the first semiconductor chip 121. The reason is that the first wiring layer 112*a* may be recessed into the first core insulating layer 111*a*. As described above, when the first wiring layer 112*a* is recessed in the first core insulating layer 111*a*, such that the lower surface of the first core insulating layer 111*a* and the lower surface of the first wiring layer 112*a* have a step therebetween, a phenomenon in which a material of the first encapsulant 130 bleeds to pollute the first wiring layer 112*a* may be prevented. The second wiring layer 112*b* of the core member 110 may be disposed on a level between an active surface and an inactive surface of the first semiconductor chip 121. The core member 110 may be formed at a thickness corresponding to that of the first semiconductor chip 121. Therefore, the second wiring layer 112*b* formed in the core member 110 may be disposed on the level between the active surface and the inactive surface of the first semiconductor chip 121.

Thicknesses of the wiring layers 112*a*, 112*b*, and 112*c* of the core member 110 may be greater than that of the first redistribution layer 142 of the first connection member 140.

Since the core member 110 may have a thickness equal to or greater than that of the first semiconductor chip 121, the wiring layers 112*a*, 112*b*, and 112*c* may be formed at large sizes depending on a scale of the core member 110. On the other hand, the first redistribution layer 142 of the first connection member 140 may be formed to have a size relatively smaller than those of the wiring layers 112*a*, 112*b*, and 112*c* for thinness.

A material of each of the core insulating layers 111*a* and 111*b* is not particularly limited. For example, an insulating material may be used as the material of each of the core insulating layers 111*a* and 111*b*. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112*a*, 112*b*, and 112*c* may serve to redistribute the first connection pads 121*b* of the first semiconductor chip 121. A material of each of the wiring layers 112*a*, 112*b*, and 112*c* may be a conductive material such as copper (Cu), aluminum (Al), silver (Ag), tin (Sn), gold (Au), nickel (Ni), lead (Pb), titanium (Ti), or alloys thereof. The wiring layers 112*a*, 112*b*, and 112*c* may perform various functions depending on designs of corresponding layers. For example, the wiring layers 112*a*, 112*b*, and 112*c* may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112*a*, 112*b*, and 112*c* may include via pads, wire pads, connection terminal pads, and the like.

The vias 113*a* and 113*b* may electrically connect the wiring layers 112*a*, 112*b*, and 112*c* formed on different layers to each other, resulting in an electrical path in the core member 110. A material of each of the vias 113*a* and 113*b* may be a conductive material. Each of the vias 113*a* and 113*b* may be completely filled with a conductive material, or a conductive material may also be formed along a wall of each of via holes. In addition, each of the vias 113*a* and 113*b* may have any shape known in the related art, such as a tapered shape, a cylindrical shape, and the like. When holes for the first vias 113*a* are formed, some of the pads of the first wiring layer 112*a* may serve as a stopper, and it may thus be advantageous in a process that each of the first vias 113*a* has the tapered shape of which a width of an upper surface is greater than that of a lower surface. In this case, the first vias 113*a* may be integrated with pad patterns of the second wiring layer 112*b*. In addition, when holes for the second vias 113*b* are formed, some of the pads of the second wiring layer 112*b* may serve as a stopper, and it may thus be advantageous in a process that each of the second vias 113*b* has the tapered shape of which a width of an upper surface is greater than that of a lower surface. In this case, the second vias 113*b* may be integrated with pad patterns of the third wiring layer 112*c*.

Contents for other configurations, for example, the third vias 155 described above with reference to FIG. 9, and the like, may be applied to the fan-out semiconductor package 100C according to another exemplary embodiment, and a detailed description thereof overlaps that described above, and is thus omitted.

Figure 13:
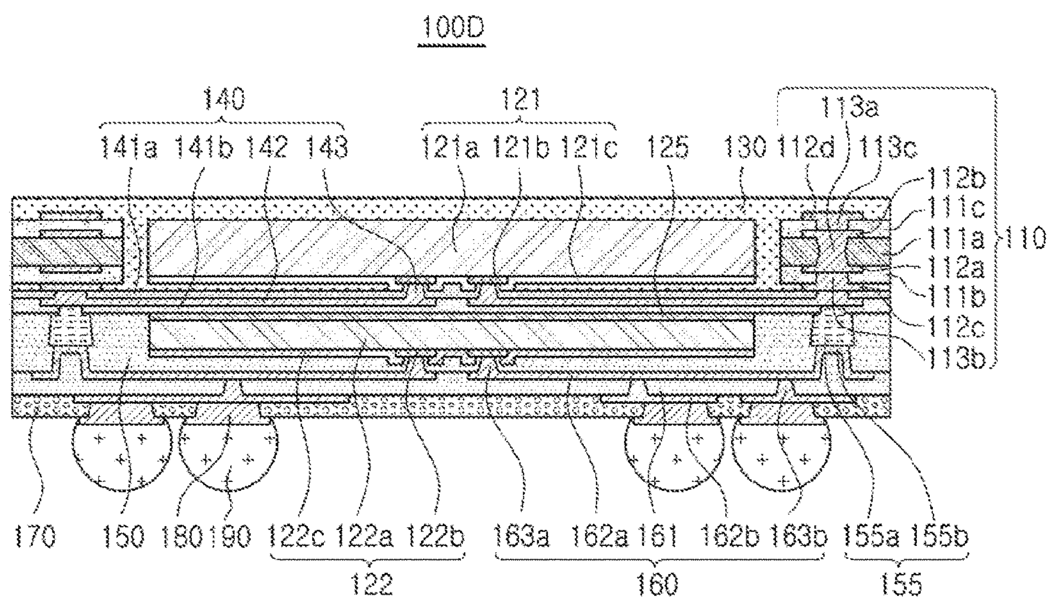
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, in a fan-out semiconductor package 100D according to another exemplary embodiment in the present disclosure, a core member 110 may include a first core insulating layer 111*a*, a first wiring layer 112*a* and a second wiring layer 112*b* disposed on opposite surfaces of the first core insulating layer 111*a*, respectively, a second core insulating layer 111*b* disposed on the first core insulating layer 111*a* and covering the first wiring layer 112*a*, a third wiring layer 112*c* disposed on the second core insulating layer 111*b*, a third core insulating layer 111*c* disposed on the first core insulating layer 111*a* and covering the second wiring layer 112*b*, and a fourth wiring layer 112*d* disposed on the third core insulating layer 111*c*. The first to fourth wiring layers 112*a*, 112*b*, 112*c*, and 112*d* may be electrically connected to first connection pads 121*b*. Since the core member 110 may include a larger number of wiring layers 112*a*, 112*b*, 112*c*, and 112*d*, a first connection member 140 may further be simplified. Therefore, a decrease in a yield depending on a defect occurring in a process of forming the first connection member 140 may be suppressed. Meanwhile, the first to fourth wiring layers 112*a*, 112*b*, 112*c*, and 112*d* may be electrically connected to each other through first to third vias 113*a*, 113*b*, and 113*c* penetrating through the first to third core insulating layers 111*a*, 111*b*, and 111*c*, respectively.

The first fore insulating layer 111*a* may have a thickness greater than those of the second core insulating layer 111*b* and the third core insulating layer 111*c*. The first core insulating layer 111*a* may be basically relatively thick in order to maintain rigidity, and the second core insulating layer 111*b* and the third core insulating layer 111*c* may be introduced in order to form a larger number of wiring layers 112*c* and 112*d*. The first core insulating layer 111*a* may include an insulating material different from those of the second core insulating layer 111*b* and the third core insulating layer 111*c*. For example, the first core insulating layer 111*a* may be, for example, prepreg including a core material, a filler, and an insulating resin, and the second core insulating layer 111*b* and the third core insulating layer 111*c* may be an ABF or a PID film including a filler and an insulating resin. However, the materials of the first core insulating layer 111*a* and the second and third core insulating layers 111*b* and 111*c* are not limited thereto. Similarly, the first vias 113*a* penetrating through the first core insulating layer 111*a* may have a diameter greater than those of second vias 113*b* and third vias 113*c* each penetrating through the second core insulating layer 111*b* and the third core insulating layer 111*c*.

A lower surface of the third wiring layer 112*c* of the core member 110 may be disposed on a level below a lower surface of the first connection pad 121*b* of a first semiconductor chip 121. In addition, a distance between a first redistribution layer 142 of the first connection member 140 and the third wiring layer 112*c* of the core member 110 may be smaller than that between the first redistribution layer 142 of the first connection member 140 and the first connection pad 121*b* of the first semiconductor chip 121. The reason is that the third wiring layer 112*c* may be disposed on the second core insulating layer 111*b* in a protruding form, resulting in being in contact with the first connection member 140. The first wiring layer 112*a* and the second wiring layer 112*b* of the core member 110 may be disposed on a level between an active surface and an inactive surface of the first semiconductor chip 121. Since the core member 110 may be formed at a thickness corresponding to that of the first semiconductor chip 121, the first wiring layer 112*a* and the second wiring layer 112_b_ formed in the core member 110 may be disposed on the level between the active surface and the inactive surface of the first semiconductor chip 121.

Thicknesses of the wiring layers 112_a_, 112_b_, 112_c_, and 112_d_ of the core member 110 may be greater than that of the first redistribution layer 142 of the first connection member 140. Since the core member 110 may have a thickness equal to or greater than that of the first semiconductor chip 121, the wiring layers 112_a_, 112_b_, 112_c_, and 112_d_ may also be formed to have large sizes. On the other hand, the first redistribution layer 142 of the first connection member 140 may be formed to have a relatively small size for thinness.

Contents for other configurations, for example, the third vias 155 described above with reference to FIG. 9, and the like, may be applied to the fan-out semiconductor package 100D according to another exemplary embodiment, and a detailed description thereof overlaps that described above, and is thus omitted.

As set forth above, according to the exemplary embodiments in the present disclosure, a fan-out semiconductor package capable of being thinned and having improved performance and excellent reliability in spite of using a plurality of semiconductor chips may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:

a first semiconductor chip having a first active surface having a first connection pad disposed thereon and a first inactive surface opposing the first active surface;

a first connection member disposed on the first inactive surface of the first semiconductor chip and including first vias and a first redistribution layer electrically connected to the first vias;

a first encapsulant covering at least portions of the first active surface of the first semiconductor chip, and extending continuously from the first active surface of the first semiconductor chip to the first connection member;

a second connection member disposed on the first encapsulant and including a second via penetrating into the first encapsulant and a second redistribution layer electrically connected to the first connection pad through the second via; and a third via penetrating through the first encapsulant, and including a metal post embedded in a portion of the first encapsulant and a via conductor disposed on the metal post and embedded in another portion of the first encapsulant, wherein the metal post connects the first redistribution layer and the via conductor to each other, and the via conductor connects the metal post and the second redistribution layer to each other.

2. The fan-out semiconductor package of claim 1, wherein the first encapsulant is formed of a single layer, and both of the metal post and the via conductor are disposed in the first encapsulant.

3. The fan-out semiconductor package of claim 1, wherein the third via is disposed at one side of the first semiconductor chip.

4. The fan-out semiconductor package of claim 1, wherein the third via has a diameter greater than a diameter of each of the first and second vias.

5. The fan-out semiconductor package of claim 1, wherein each of the metal post and the via conductor has a tapered shape.

6. The fan-out semiconductor package of claim 1, wherein a height of the metal post is smaller than a height of the first semiconductor chip.

7. The fan-out semiconductor package of claim 1, wherein the first connection member further includes a first insulating layer disposed on the first redistribution layer, and the metal post penetrates through the first insulating layer.

8. The fan-out semiconductor package of claim 7, wherein a portion of the metal post penetrating through the first insulating layer and a remaining portion of the metal post embedded in the first encapsulant define step.

9. A fan-out semiconductor package comprising:

a semiconductor chip having an active surface having a connection pad disposed thereon and an inactive surface opposing the active surface;

a first connection member disposed on the inactive surface of the semiconductor chip and including a first via and a first redistribution layer connected to each other;

an encapsulant encapsulating at least portions of the semiconductor chip;

a second connection member disposed on the active surface of the semiconductor chip, and including a second via and a second redistribution layer connected to the connection pad through the second via; and a third via penetrating through the encapsulant, and including a metal post and a via conductor disposed on the metal post, wherein the metal post connects the first redistribution layer and the via conductor to each other, and the via conductor connects the metal post and the second redistribution layer to each other, the via conductor extends along walls of a via hole in the encapsulant and one surface of the metal post and has a recess towards the metal post, and the second connection member further includes an insulating layer disposed on the second redistribution layer and filling the recess of the via conductor.

10. The fan-out semiconductor package of claim 9, wherein a thickness of the via conductor is less than that of the metal post.

11. The fan-out semiconductor package of claim 1, further comprising:

a second semiconductor chip having a second active surface having second connection pads disposed thereon and a second inactive surface opposing the second active surface; and a second encapsulant encapsulating at least portions of the second semiconductor chip, wherein the first connection member is disposed between the second active surface of the second semiconductor chip and the first inactive surface of the first semiconductor chip, and the first redistribution layer is connected to the second connection pads through the first vias.

12. The fan-out semiconductor package of claim 11, further comprising a core member having a through-hole, wherein the second semiconductor chip is disposed in the through-hole of the core member.

13. The fan-out semiconductor package of claim 12, wherein the core member includes a core insulating layer, a first wiring layer in contact with the first connection member and embedded in the core insulating layer, and a second wiring layer disposed on the other surface of the core insulating layer opposing one surface of the core insulating layer in which the first wiring layer is embedded, and the first and second wiring layers are electrically connected to the second connection pads.

14. The fan-out semiconductor package of claim 12, wherein the core member includes a core insulating layer and a first wiring layer and a second wiring layer disposed on opposite surfaces of the core insulating layer, respectively, and the first and second wiring layers are electrically connected to the second connection pads.

15. The fan-out semiconductor package of claim 12, wherein the core member includes a first core insulating layer, a first wiring layer and a second wiring layer disposed on opposite surfaces of the first core insulating layer, respectively, a second core insulating layer disposed on the first core insulating layer and covering the first wiring layer, a third wiring layer disposed on the second core insulating layer, a third core insulating layer disposed on the first core insulating layer and covering the second wiring layer, and a fourth wiring layer disposed on the third core insulating layer, and the first to fourth wiring layers are connected to second connection pads.

16. The fan-out semiconductor package of claim 1, wherein a lower end of the metal post in contact with an upper end of the via conductor has a diameter greater than that of the upper end of the via conductor.

17. A fan-out semiconductor package comprising:

a first semiconductor chip having a first active surface having a first connection pad disposed thereon and a first inactive surface opposing the first active surface;

a first connection member disposed on the first inactive surface of the first semiconductor chip, and including a first redistribution layer and an insulating layer disposed on the first redistribution layer and having an opening exposing a portion of the first redistribution layer;

a second connection member disposed on the first active surface of the first semiconductor chip and including a second redistribution layer electrically connected to the first connection pad; and a stack via disposed outside the first semiconductor chip, connecting the first redistribution layer and the second redistribution layer to each other, and including a metal post and a via conductor disposed on the metal post, wherein the metal post includes a portion filling the opening of the insulating layer of the first connection member and another portion connecting the portion filling the opening of the insulating layer of the first connection member and the via conductor, the portion of the metal post filling the opening of the insulating layer of the first connection member and the another portion of the metal post connected to the via conductor define a step, and a width of the portion of the metal post filling the opening of the insulating layer of the first connection member is less than a width of the another portion of the metal post connected to the via conductor.

18. The fan-out semiconductor package of claim 17, further comprising a first encapsulant encapsulating at least portions of the first semiconductor chip, wherein both of the metal post and the via conductor are disposed in the first encapsulant.

19. The fan-out semiconductor package of claim 18, wherein the first connection member further includes first vias connected to the first redistribution layer, and the second connection member further includes a second via connecting the first connection pad and the second redistribution layer to each other, and the stack via has a diameter greater than a diameter of each of the first and second vias.

20. The fan-out semiconductor package of claim 17, wherein a lower end of the metal post in contact with an upper end of the via conductor has a diameter greater than that of the upper end of the via conductor.

21. The fan-out semiconductor package of claim 19, further comprising:

a second semiconductor chip having a second active surface having second connection pads disposed thereon and a second inactive surface opposing the second active surface; and a second encapsulant encapsulating at least portions of the second semiconductor chip, wherein the first connection member is disposed between the second active surface of the second semiconductor chip and the first inactive surface of the first semiconductor chip, and the first redistribution layer is connected to the second connection pads through the first vias.

22. The fan-out semiconductor package of claim 5, wherein the metal post has a width increasing in a direction from the first redistribution layer to the second redistribution layer, and the conductor via has a width increasing in the direction from the first redistribution layer to the second redistribution layer.

23. The fan-out semiconductor package of claim 11, wherein all of the second connection pads connected to the first vias are redistributed outwardly of the second semiconductor chip through the first redistribution layer.

* * * * *